(12) United States Patent
Ausserlechner

(10) Patent No.: US 10,663,533 B2
(45) Date of Patent: May 26, 2020

(54) CALIBRATION OF A CURRENT SENSOR

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 143 days.

(21) Appl. No.: 15/451,682

(22) Filed: Mar. 7, 2017

(65) Prior Publication Data

US 2017/0261565 A1 Sep. 14, 2017

(30) Foreign Application Priority Data

Mar. 11, 2016 (DE) .................. 10 2016 104 455

(51) Int. Cl.
*G01R 33/00* (2006.01)
*G01R 33/07* (2006.01)

(52) U.S. Cl.
CPC ......... *G01R 33/0017* (2013.01); *G01R 33/07* (2013.01)

(58) Field of Classification Search
CPC .............. G01R 33/0017; G01R 33/07
See application file for complete search history.

(56) References Cited

U.S. PATENT DOCUMENTS

| 9,310,398 | B2 | 4/2016 | Ausserlechner | |
|---|---|---|---|---|
| 9,389,247 | B2 | 7/2016 | Ausserlechner | |
| 2008/0246470 | A1* | 10/2008 | Kahlman | B82Y 25/00 324/234 |
| 2012/0016614 | A1* | 1/2012 | Hohe | G01R 33/0017 702/85 |
| 2014/0097835 | A1* | 4/2014 | Sartee | G01R 33/07 324/251 |
| 2015/0301149 | A1* | 10/2015 | Cesaretti | G01R 33/075 324/202 |
| 2015/0348349 | A1* | 12/2015 | Meisenberg | G07D 7/04 324/244 |
| 2015/0377648 | A1* | 12/2015 | Sirohiwala | G01D 5/145 324/207.2 |

\* cited by examiner

*Primary Examiner* — Akm Zakaria
(74) *Attorney, Agent, or Firm* — Eschweiler & Potashnik, LLC

(57) ABSTRACT

An apparatus for calibrating a sensor unit is provided, wherein the sensor unit includes a sensor housing, a first magnetic sensor and a second magnetic sensor, wherein the first magnetic sensor is adapted to detect magnetic field components in a first direction, wherein the second magnetic sensor is adapted to detect magnetic field components in a second direction, wherein the first direction is not parallel to the second direction. The apparatus further includes a magnetic field generating device, which is adapted so that at least one magnetic field acts on the sensor unit, wherein the calibration of the sensor unit can be carried out with the aid of responses of the first magnetic sensor and of the second magnetic sensor to the magnetic field. A corresponding calibration method is furthermore provided.

24 Claims, 2 Drawing Sheets

CALIBRATION OF A CURRENT SENSOR

CROSS REFERENCE TO RELATED APPLICATIONS

This application claims priority to German Patent Application number 10 2016 104 455.5 filed on Mar. 11, 2016, which is hereby incorporated in its entirety.

FIELD

The disclosure relates to an apparatus and a method for calibrating a current sensor.

BACKGROUND

There are current sensors which measure an electrical current through an electrical conductor. The current in this case generates a magnetic field, and the current sensor measures this magnetic field and deduces the strength of the current.

In this case, the exact position of the current sensor (or of the sensor elements of the current sensor) with respect to the electrical conductor is critical: as the magnetic field of the current conductor is highly inhomogeneous, even a minor position change of the current sensor can greatly influence or modify the magnetic field on the sensor elements.

Current sensors are known in which the electrical conductor is an integral component of the sensor housing. The conductor and the current sensor are therefore located at a fixed spatial distance from one another. The producer of the current sensor undertakes the calibration, i.e. the positioning of the sensor element in relation to the electrical conductor.

Furthermore, current sensors are known in which the electrical conductor is not a component of the sensor housing. Such current sensors have a sensor housing which, for example, is fastened on the electrical conductor by a customer. Because of tolerances in the fastening, however, it often occurs that the sensor element does not exactly detect the desired magnetic field, but instead a magnetic field differing therefrom. This leads to an error in the current measurement which may for example lie in a range of from 5% to 15%. This is disadvantageous when a higher accuracy of the current measurement is required, in particular an error of at most 1%.

DE 10 2012 110 406 A1 discloses a proposal for current measurement, in which the current sensor comprises two types of sensor elements (for example Hall plates and vertical Hall sensors). The first type of sensor detects a magnetic field component perpendicular to a conductor surface, and the second type of sensor detects a magnetic field component parallel to the same conductor surface. If the relative magnetic sensitivity of the two sensor types with respect to one another is know, the position of the sensor elements can be deduced with high accuracy from the ratio of the two measurement values, and accurate calibration of the current sensor is therefore achieved.

In this case, however, it is a problem that two different types of sensors are required, for which, for example for technological reasons, the relative magnetic sensitivity with respect to one another cannot be known sufficiently accurately. With different types of sensors, for example, different process variances or individual variances of the sensors may occur, which require additional compensation measures (so-called trimming procedures). Without such compensation measures, the ratio of the magnetic sensitivities on the chip is only known to 1±4%. This leads, for example, to an uncertainty of the order of 8% (tolerance band), which results for example because of variances of layer thicknesses, different doping concentrations, different outward diffusion and/or different influences of mechanical stresses on the two sensor elements.

SUMMARY

It is therefore an object to provide an efficient approach for calibration of the sensor elements.

This object is achieved according to the features of the independent claims. Preferred embodiments may be found particular in the dependent claims.

In order to achieve the object, an apparatus for calibrating a sensor unit is provided, wherein the sensor unit comprises a sensor housing, a first magnetic sensor and a second magnetic sensor. The first magnetic sensor is adapted to detect magnetic field components in a first direction, and the second magnetic sensor is adapted to detect magnetic field components in a second direction. Further, the first direction is not parallel to the second direction. The apparatus further comprises a magnetic field generating device, which is adapted so that at least one magnetic field acts on the sensor unit, wherein the calibration of the sensor unit can be carried out with the aid of responses of the first magnetic sensor and of the second magnetic sensor to the magnetic field.

In particular, the sensor unit may comprise more than two magnetic sensors. It is also an option to use two types of magnetic sensors, at least one magnetic sensor being provided per type.

The magnetic field generating device may be any type of apparatus, element or arrangement of a plurality of elements, with the aid of which at least one magnetic field that acts on the sensor unit can be generated. On the basis of the at least one magnetic field, the magnetic sensors deliver a reaction (here referred to as a "response"), for example in the form of a measurement signal. It should be noted here that the at least one magnetic field may involve one or more magnetic fields or variations of at least one magnetic field. The response may in this case also be a signal which corresponds to a time profile.

The calibration of the sensor unit may be carried out by means of any desired processing unit which is adapted to calibrate the sensor unit with the aid of responses of the first magnetic sensor and of the second magnetic sensor to the magnetic field.

This processing unit may, in particular, be configured as a processor unit and/or an at least partially hard-wired or logical circuit arrangement, which is for example adapted in such a way that the method as described here can be carried out. Said processing unit may be or comprise any type of processor or calculator or computer with corresponding required peripherals (memories, input/output interfaces, input/output devices, etc.).

It is one refinement that the magnetic field generating device is configured separately from the sensor housing.

It is one refinement that the magnetic field generating device is arranged in the sensor housing.

It is one refinement that the magnetic field generating device generates at least two differently strong magnetic fields, which act on at least one of the magnetic sensors.

Optionally, in a rotational angle sensor, a magnetic field of constant strength may rotate. It is also possible for a magnet to be moved (for example rotated) to two different distances in order to test whether the angle sensor is functioning correctly between a minimum and a maximum magnetic field. The magnet may be moved to two different distances by rotating the magnet first, for example, 2 mm above the magnetic sensor and then, for example, 4 mm above the magnetic sensor. In this example, the magnet is displaced along the rotation axis to two different positions.

It is one refinement that the first magnetic sensor and the second magnetic sensor have a predetermined distance from one another.

For example, an advantageous distance lies in a range of between 0.5 mm and 3 mm.

For example, in a current sensor, two magnetic sensors are used which have a particular distance from one another, in order to be able to separate the magnetic field of the conductor from interfering background fields. In particular, the conductor may be arranged between the two magnetic sensors. In this case, the two magnetic sensors detect an (essentially) equally strong magnetic field in different directions. If the signals of the two magnetic sensors are subtracted from one another, the magnitudes of the current conductor are thereby added and homogeneous interference fields are at the same time highlighted. The distance of the magnetic sensors is preferably selected to be so great that all the current passes between them, i.e. so that the magnetic field can be detected as fully as possible; on the other hand, however, the distance should not be unnecessarily great for spatial efficiency reasons.

If the current is small (for example 100 mA), then the conductor may be thin (for example it may have a thickness of 0.5 mm) and the distance of the magnetic sensors from one another may also be relatively small (for example 0.7 mm). If the current is large (for example 100 A), however, then the conductor cross section is preferably about 10 mm$^2$, since the current density in the conductor should not be more than 10 A/mm$^2$ to 15 A/mm$^2$, in order to prevent the conductor from becoming too hot. Such a conductor may have a diameter of 11 mm, and the magnetic sensors may correspondingly be separated far apart from one another. Since a semiconductor chip is usually not very large for cost reasons, however, in the case of currents of more than 5 A, for example, the available chip size 1.5 mm to 3 mm is used for the distance of the sensors.

It is one refinement that the sensor unit is a current sensor.

It is one refinement that the magnetic field generating device generates a magnetic field which is essentially proportional to an electrical current.

It is one refinement that the magnetic field generating device generates at least two magnetic fields, which act on at least one of the magnetic sensors.

It is one refinement that at least one of the two magnetic fields acts inhomogeneously on the at least one magnetic sensor.

In particular, the inhomogeneously acting magnetic field on the magnetic sensor has an inhomogeneity of more than 1% per 0.5 mm.

It should be noted here that the magnetic field of the conductor is usually inhomogeneous.

In the example of a cylindrical conductor, the magnetic field is proportional to the inverse radial distance (1/radial distance), the radial distance being the distance between the cylinder axis (the core of the conductor) and the reference point. If the radial distance is 10 mm and the positioning tolerance is 0.1 mm, for example, then the magnetic field changes by 0.1/10=0.01=1%. This is an estimate of a real inhomogeneity. If there are two conductors with a rectangular cross section, then one is somewhat nearer and the other somewhat further away, so that the latter will have a homogeneity somewhat better than 1%/0.1 mm.

It is one refinement that the first direction is essentially perpendicular to the second direction.

It is one refinement that the at least one magnetic field generated by the magnetic field generating device comprises an inhomogeneous magnetic field on at least one sensor element.

It is one refinement that the first magnetic sensor and the second magnetic sensor are sensors of different types.

For example, the following types of magnetic sensors may be used: Hall plates, vertical Hall sensors, horizontal Hall sensors, magnetoresistive (MR) sensors, for example anisotropic MR (AMR) sensors, giant MR (GMR) sensors, tunneling MR (TMR) sensors, colossal MR (CMR) sensors, MAGFETs.

It is one refinement that the two magnetic sensors are Hall sensors, which detect magnetic field components acting in different directions.

It is one refinement that the at least one magnetic field comprises at least two magnetic fields, the spatial distribution of which is arranged so that the ratio of the responses of the first magnetic sensor to the two magnetic fields is not equal to the ratio of the responses of the second magnetic sensor to the two magnetic fields.

It is one refinement that a first magnetic field is generated by a first current-carrying conductor and a second magnetic field is generated by a second current-carrying conductor, the first current-carrying conductor and the second current-carrying conductor having a different distance from the sensor unit and/or a different orientation with respect to the sensor unit.

It is one refinement that the magnetic field generating device comprises at least one current-carrying conductor.

It is one refinement that the sensor unit furthermore comprises a semiconductor chip, on which or in which the first magnetic sensor and the second magnetic sensor are arranged, a frame, on which the semiconductor chip is arranged, wherein the sensor housing is a plastic housing.

In particular, the sensor housing is at least partially an encapsulation of the components i.e. the sensors, of the semiconductor chip, of the frame.

It is one refinement that the semiconductor chip is adhesively bonded on the frame.

It is one refinement that the sensor housing is arranged on a base plate.

In particular, the sensor housing may be arranged in a recess of the base plate. It is furthermore an option for the base plate to comprise at least one conductor. The current through this at least one conductor may be detected by the sensor unit explained here (after successful calibration).

The explanations above relating to the apparatuses apply correspondingly for the method. The respective apparatus may be formed in one component or distributed over a plurality of components.

It is one refinement that at least one magnetic sensor has a sensitivity essentially in a direction perpendicular to the semiconductor chip.

In order to achieve the object, a method for calibrating a sensor unit is also provided, wherein the sensor unit comprises a sensor housing, a first magnetic sensor and a second magnetic sensor. The first magnetic sensor is adapted to detect magnetic field components in a first direction, and the second magnetic sensor is adapted to detect magnetic field components in a second direction. Further, the first direction is not parallel to the second direction. The method further comprises a magnetic field generating device, which is adapted so that at least one magnetic field which acts on the sensor unit is emitted, wherein the calibration of the sensor unit is carried out with the aid of responses of the first magnetic sensor and of the second magnetic sensor to the magnetic field.

It is one refinement that the at least one magnetic field comprises at least two magnetic fields, the spatial distribution of which is arranged so that the ratio of the responses of the first magnetic sensor to the two magnetic fields is not equal to the ratio of the responses of the second magnetic sensor to the two magnetic fields.

It is one refinement that a first magnetic field is generated by a first current-carrying conductor and a second magnetic field is generated by a second current-carrying conductor, the first current-carrying conductor and the second current-carrying conductor having a different distance from the sensor unit and/or a different orientation with respect to the sensor unit.

It is one refinement that the calibration of the sensor unit is determined with the aid of responses of the first magnetic sensor and of the second magnetic sensor as magnetic sensitivities of the magnetic sensors.

The magnetic sensitivities may, for example, be stored in encoded form in a memory which is optionally assigned to the sensor elements. It may, for example, be an EEPROM on the same chip.

After calibration has been carried out, the specimen may thus be used in its position while taking into account the ascertained sensitivities of the sensor elements in order to measure the electrical current through the conductor.

The above-described properties, features and advantages, as well as the way in which they are achieved, will be explained further in connection with the following schematic description of exemplary embodiments, which will be explained in more detail in connection with the drawings. For clarity, elements which are the same or have the same effect may be provided with the same references.

DETAILED DESCRIPTION

One exemplary solution proposes to use at least two selectively activatable magnetic field sources for the calibration, instead of a single magnetic field source. The two magnetic field sources preferably have a known situation with respect to one another. In particular, the positioning of the two magnetic field sources with respect to one another is thus known.

Calibration may, for example, be carried out as follows. A specimen is positioned close to a magnet arrangement. A relatively accurate position of the specimen is advantageous, although minor inaccuracies can be compensated for. In particular, it is advantageous for the position of the specimen to remain (essentially) unmodified during the calibration. The specimen is, in particular, an arrangement comprising a semiconductor chip (also referred to as the chip), which is arranged on a frame (lead frame). A plurality of sensor elements may be arranged on the chip. The arrangement comprising the chip, the lead frame and sensor elements may be cast in plastic (i.e. enclosed by plastic encapsulation). As already mentioned, the chip with the sensor elements may have a certain positioning tolerance relative to the frame, and this should be taken into account during the calibration.

The sensor elements may also be referred to as the sensor.

(ii) A magnetic field is generated by a first part of the magnetic field source, and a response of the sensor elements is measured.

The response is in particular a measurement response i.e. at least one signal, which is measured as a result of the applied magnetic field. In particular, different magnetic fields induce different signals, i.e. in this sense "responses".

(iii) A magnetic field is generated by a second part of the magnetic field source, and the response of the sensor elements is measured. There is preferably a predetermined geometrical relationship between the first and second parts of the magnetic field source. There is also preferably a predetermined relationship between the strength of the first magnetic field source and the strength of the second magnetic field source. For example, the two magnetic field sources may be in a particular positional relationship to one another. The two magnetic field sources may also provide magnetic fields whose strengths are in a particular ratio to one another.

(iv) Magnetic sensitivities of the sensor elements are determined from the measurement data.

(v) The magnetic sensitivities may, for example, be stored in encoded form in a memory which is optionally assigned to the sensor elements. It may, for example, be an EEPROM on the same chip, or it is a package slip on which these values are noted.

After calibration has been carried out, the specimen may thus be used in its position while taking into account the ascertained sensitivities of the sensor elements in order to measure the electrical current through the conductor.

Exemplary Embodiment

Figure 1:
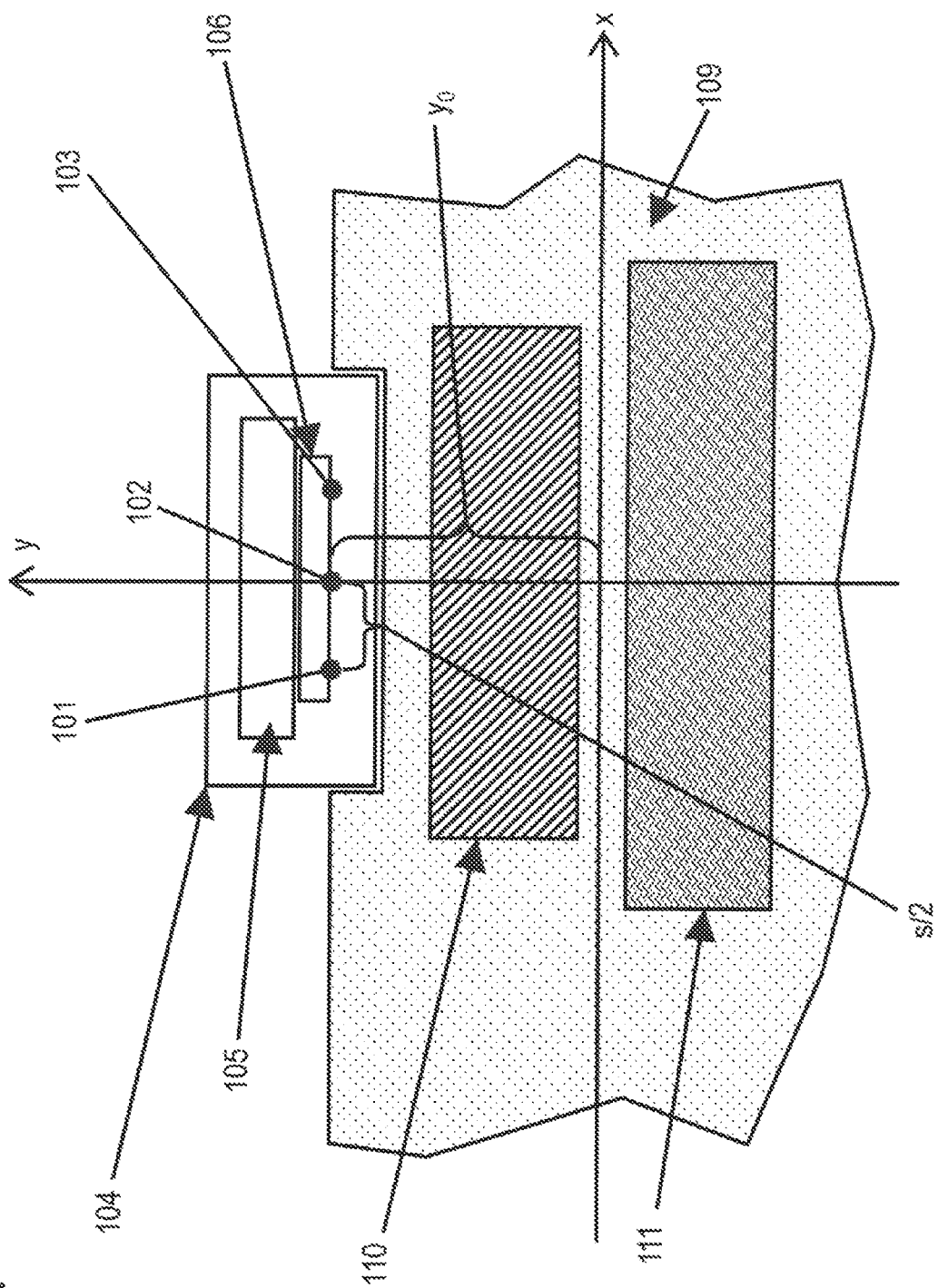
FIG. 1 shows an exemplary arrangement for the calibration of a specimen.

FIG. 1 shows an exemplary arrangement for calibrating a specimen 104. The specimen 104 is in this case, for example, configured as a sensor element in plastic encapsulation. The specimen comprises a chip 106, on which by way of example 3 sensor elements 101, 102 and 103 are arranged. The chip is arranged, for example adhesively bonded, on a frame (lead frame) 105. The specimen 104 is placed in a recess of a base plate 109. Below the recess, and therefore below the specimen, a first conductor 110, and below this a second conductor 111, are embedded in the base plate 109.

By way of example, an x-y plane (coordinate system) is indicated in FIG. 1. The central sensor element 102 has a distance y0 from the origin of the coordinate system. The distance between the sensor element 101 and the sensor element 102 is s/2, and the distance between the sensor element 101 and the sensor element 103 is s. In FIG. 1, the sensor elements 101 to 103 lie on a straight line which extends parallel to the x axis.

The conductors 110 and 111 are arranged, for example, above one another as parallel band-shaped conductors. The specimen 104 has, for example, the same sensor elements as described in DE 10 2012 110 406 A1. The specimen 104 is arranged above the two conductors 110, 111. The conductors 110, 111 are, for example, manufactured with high precision, so that their geometry and their position (for example with respect to one another) are known.

In the example shown in FIG. 1, the specimen 104 lies above the conductor 110 in the recess of the base plate 109.

The sensor elements 101 to 103 are positioned relatively accurately with respect to the two band-shaped conductors (for example to less than $\frac{1}{10}^{th}$ of a millimeter and with a maximum tilt of 5 degrees).

There are furthermore tolerances which cannot be neglected: for example, the specimen 104 may comprise the chip 106 which has been adhesively bonded onto the frame 105 (lead frame), the chip 106 and the frame 105 being encapsulated with the plastic-like casting compound. The thickness of the chip 106 may, for example, have a tolerance of 5 μm or even up to 20 μm, and an adhesive bond may additionally have a tolerance of 50 μm. Furthermore, the adhesive bond may be configured in the shape of a wedge, so that the surface of the chip 106 is not exactly parallel to the surface of the conductor 110. The frame 105 may have a tolerance of 10 μm in its thickness, and may possibly be provided with burrs which contribute to the frame 105 being tilted relative to the horizontal (here: the x axis). Laterally, the chip 106 may be displaced by up to 200 μm because of positioning tolerances (for example as a result of so-called pick-and-place positioning of a machine used for the positioning process). Furthermore, the chip 106 may float during mounting of the chip on the frame because of the adhesive not being fully cured during the placement, which leads to an additional tolerance of the actual position of the chip 106. The casting compound may be inaccurate in its shape because of a casting process, a subsequent cure-shrink process (i.e. continued crosslinking of the chemical bonding structure), swelling by moisture absorption from the ambient air, etc., and contribute to further tolerances.

Thus, unknown tilting (θ) of the chip 106 relative to the surface of the conductor 110, and respectively an unknown offset ($\delta_x$, $\delta_y$) in the two directions perpendicular and parallel to the surface of the conductor 110, may occur.

The chip 106 comprises, for example, the three sensor elements 101, 102, 103 at three positions which lie on a line and respectively have a distance s/2 from the neighboring sensor element.

The positions of the sensor elements 101 to 103 with respect to one another are relatively accurate, since they can be established by microelectronic fabrication means. In this case, for example, tolerances of less than 1 μm may be ensured.

The sensor elements 101 and 103 detect vertical magnetic fields $B_{y1}$, $B_{y3}$ with the magnetic sensitivities $S_{y1}$, $S_{y3}$. The sensor element 102 detects horizontal fields $B_{x2}$ with the magnetic sensitivity $S_{x2}$. In this case, for example, the sensitivity $S_{x2}$ differs significantly (for example by 10%) from the sensitivities $S_{y1}$ and $S_{y3}$ respectively. The sensitivities $S_{y1}$ and $S_{y3}$ may also be different, their difference (for example 2%) being for example less than the difference from the sensitivity $S_{x2}$. The difference between the sensitivities of the sensor elements 101 and 103 may be referred to as a pairing tolerance ("mismatch").

There is therefore a system with a total of six unknowns: ϑ, $\delta_x$, $\delta_y$, $S_{y1}$, $S_{x2}$, $S_{y3}$.

Calibration determines these six unknowns, or at least the three sensitivities $S_{y1}$, $S_{x2}$ and $S_{y3}$.

To this end, for example, a first current is sent through the first conductor and the signals S1', S2', S3' of the three sensor elements 101, 102, 103 are measured.

A second current is subsequently sent through the second conductor, and the signals S1", S2", S3" of the three sensor elements 101, 102, 103 are measured.

There are therefore six measurement values, with which the six unknowns can be determined.

The ratio of the two currents, i.e. of the first current to the second current (or vice versa) is preferably known. Optionally, the ratio of the two currents is equal to one.

The problem presented here may be defined as follows:

The signals $S_1$, $S_2$, $S_3$ of the three sensors 101, 102, 103 depend in the following way on the magnetic fields at the three positions of the sensors:

$$S_1 = S_y(1+M/2)\{B_{y1} \cos\vartheta + B_{x1} \sin\vartheta\},$$

$$S_2 = S_x\{-B_{y2} \sin\vartheta + B_{x2} \cos\vartheta\},$$

$$S_3 = S_y(1-MM/2)\{B_{y3} \cos\vartheta + B_{x3} \sin\vartheta\},$$

where ($x_1$, $y_1$) denotes the position of the sensor element 101,
($x_2$, $y_2$) denotes the position of the sensor element 102,
($x_3$, $y_3$) denotes the position of the sensor element 103.

If the field components ($B_{x1}$, $B_{y1}$) at the position ($x_1$, $y_1$) of the sensor element 101 are measured, the following applies for this position:

$$(x_1, y_1) = (\delta_x - 0.5 \times s \cos\vartheta, y_0 + \delta_y - 0.5 \times s \sin\vartheta).$$

If the field components ($B_{x2}$, $B_{y2}$) at the position ($x_2$, $y_2$) of the sensor element 102 are measured, the following applies for this position:

$$(x_2, y_2) = (\delta_x, y_0 + \delta_y).$$

If the field components ($B_{x3}$, $B_{y3}$) at the position ($x_3$, $y_3$) of the sensor element 103 are measured, the following applies for this position:

$$(x_3, y_3) = (\delta_x + 0.5 \times s \cos\vartheta, y_0 + \delta_y + 0.5 \times s \sin\vartheta).$$

Here:

s is the distance between the sensor element 101 and the sensor element 103;

s/2 is the distance between the sensor element 101 and the sensor element 102, and also the distance between the sensor element 102 and the sensor element 103;

$y_0$ Is a so-called nominal y position of the chip surface;

$S_x$ is the magnetic sensitivity of the vertical Hall sensor to the magnetic fields in the x direction ($B_x$);

$S_y(1+MM/2)$ is the magnetic sensitivity of the sensor element 101 (horizontal Hall sensor element) to magnetic fields in the y direction ($B_y$);

$S_y(1-M/2)$ is the magnetic sensitivity of the sensor element 103 (horizontal Hall sensor element) to magnetic fields in the y direction ($B_y$);

MM is a deviation ("mismatch") of the two sensor elements 101 and 103.

In this example, the sensor element 101 and the sensor element 103 are a sensor element of the first type (for example a horizontal Hall sensor) and the sensor element 102 is a sensor element of the second type (for example a vertical Hall sensor).

Advantageously, the calibration apparatus explained here may, in particular, be used when the specimen is part of a "strip".

For example, it is possible to use an arrangement of 15 columns and 5 rows, in which the sensor housings (chips with sensor elements) are arranged on a strip. This strip initially consists of a structured copper sheet, the frame (lead frame). The chips are adhesively bonded thereon, then the connections between the bonding pads on the chips and leads, or pins, on the lead frame are produced with bonding wires. The entire strip then enters an injection mold ("mold tool") where a plastic compound is injection-molded, or cast, around the chips together with bonding wires. The terminals (optionally with the exception of the ground pins)

are stamped free, but the sensor housings still remain fastened on the frame at "dam bars".

The entire frame is electrically tested in a testing device (a so-called "in-strip tester"). In this case, for example, a robotic arm places the strip on a base plate, and thin needles of a contact board contact the terminal branches of one or more components. Predetermined electrical parameters (for example current drawn at various voltages) are then measured.

The two current conductors are in this case advantageously fitted in the base plate of the testing device. The robotic arm can then place the strip on the base plate with significant tolerance. The base plate may furthermore have a profile, with the aid of which rough positioning of the components on the so-called chuck or plunger head (also referred to as the base plate) is defined. The base plate is, in particular, a bottom plate which is laterally mobile. The base plate may be moved to a loading position where for example a gripper places the previously thermally regulated lead frame strip on the plate. The base plate then travels to a contact position where the tests for the devices to be tested are carried out. The base plate is subsequently moved to an unloading position, where a gripper lifts the tested lead frame strip off and deposits it in a removal cassette.

Finer positioning tolerances are computationally determined as shown above using the 2 currents and 6 measurement quantities of the 3 sensor elements, and can thus be reduced or eliminated during subsequent use of the respective current sensor.

The conductors may in this case be arranged row- or column-wise below the strip, preferably in such a way that their number is minimized. In particular, it is possible to provide switches or relays which send the current selectively through the first or second conductor (alternatively, it is also possible always to send the current through both conductors, but to make the current flow direction in one of the two selectively switchable). Optionally, a plurality of "devices under test" (DUTs) may have a magnetic field applied to them simultaneously, or essentially at the same time, when they lie over the same conductors. To this end, the conductor may for example be formed in the shape of a serpentine or in the shape of a spiral, so that the magnetic field can be applied essentially together to more than one row or column of the DUTs arranged in the shape of a matrix. In one example, all or a selection of the DUTs may thus be calibrated simultaneously.

Figure 2:
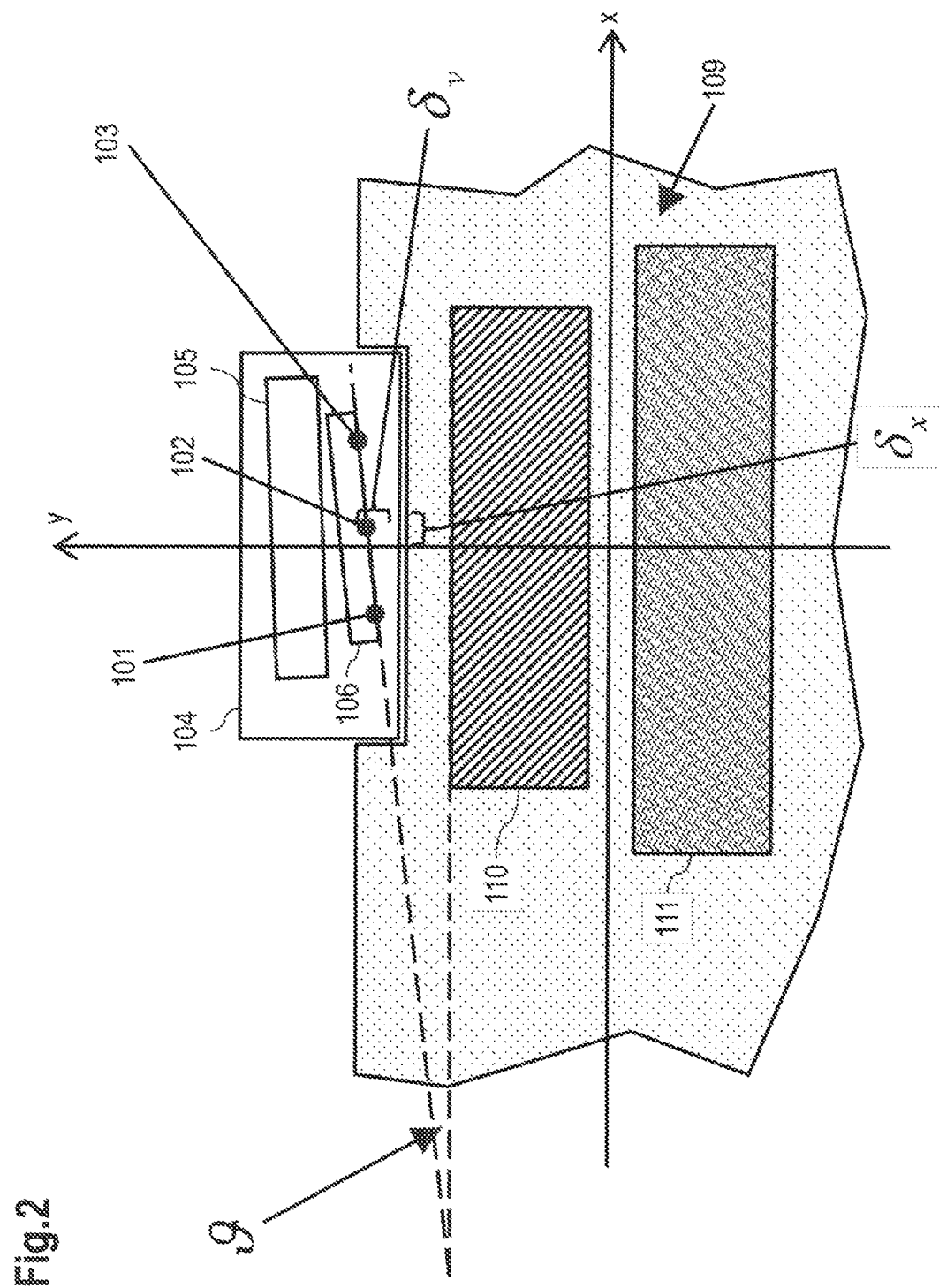
FIG. 2 shows, based on the representation of FIG. 1, an exemplary diagram to illustrate the positioning tolerances θ, $\delta_x$, $\delta_y$.

On the basis of the representation of FIG. 1, FIG. 2 shows an exemplary diagram to illustrate the positioning tolerances $\vartheta$, $\delta_x$, $\delta_y$. FIG. 2 again represents the specimen 104, which comprises the chip 106 with sensor elements 101 to 103 and the frame 105 in plastic encapsulation. The specimen 104 is positioned in a recess of the base plate 109, which again encloses the two conductors 110 and 111. The x-y coordinate system is also represented in FIG. 2.

The conductors 110 and 111—as in FIG. 1—have a surface which is parallel to the x axis. In contrast to FIG. 1, the frame 105 is represented as slightly inclined (tilted) relative to the x axis and the chip 106 as more greatly inclined relative to the x axis. This leads to a y offset $\delta_y$, an x offset $\delta_x$ and a tilt angle $\vartheta$ for the chip 106 and the sensor elements 101 to 103 positioned on the chip 106.

For example, instead of measuring a signal of a sensor for a certain current, or a certain magnetic field, a signal variation following a current variation or a magnetic field variation may also be measured. In this way, static background fields or interference fields (DC components) may be eliminated. Optionally, the current direction may be inverted for this purpose. It is also an option for the measurement to be integrated and/or averaged over time over an integer multiple of a period of the dominant AC interference (for example the mains frequency).

If the positioning tolerances $\vartheta$, $\delta_x$, $\delta_y$ are sufficiently small (for example $\vartheta$ less than 1 degree, $\delta_x$ and $\delta_y$ each less than 50 µm), they may be set to zero. In this case, the current through one conductor is sufficient in order to obtain 3 measurement values of the 3 sensors and calculate the 3 unknowns $S_x$, MM, $S_y$ therefrom.

If the deviation MM of the y sensors is sufficiently small (for example MM less than 0.4%, it may be set to zero. Per current, measurement of the signal combination S1−S3 or S1+S3 is then sufficient, instead of measurements of both signals S1 and S3 (i.e. it is possible to save on one measurement).

Although the disclosure has been illustrated and described in detail by the at least one exemplary embodiment shown, the disclosure is not restricted thereto, and other variants may be derived therefrom by the person skilled in the art without departing from the protective scope of the disclosure.

What is claimed is:

1. An apparatus for calibrating a sensor unit, wherein the sensor unit comprises:
    a sensor housing,
    a first magnetic sensor and
    a second magnetic sensor,
    a magnetic field generating device, which is configured to generate a first magnetic field over a first time period and a second magnetic field over a second time period that act on the sensor unit, wherein the second magnetic field has a different magnitude than the first magnetic field, wherein the first time period and the second time period are different, non-overlapping time periods, wherein the first magnetic field and the second magnetic field each have a first component and a second component, and wherein the first component of the first and second magnetic fields is not parallel to the second component of the first and second magnetic fields, respectively,
    wherein the first magnetic sensor is adapted to detect the first component of the first magnetic field and the first component of the second magnetic field,
    wherein the second magnetic sensor is adapted to detect the second component of the first magnetic field and the second component of the second magnetic field, and
    a processing circuit configured to calibrate the sensor unit using the first components of the first and second magnetic fields detected by the first magnetic sensor and using the second components of the first and second magnetic fields detected by the second magnetic sensor.

2. The apparatus as claimed in claim 1, wherein the magnetic field generating device is configured separately from the sensor housing.

3. The apparatus as claimed in claim 1, wherein the magnetic field generating device is arranged in the sensor housing.

4. The apparatus as claimed in claim 1, wherein the first magnetic sensor and the second magnetic sensor have a predetermined distance from one another.

5. The apparatus as claimed in claim 1, wherein the sensor unit is a current sensor.

6. The apparatus as claimed in claim 5, wherein the magnetic field generating device generates a magnetic field which is essentially proportional to an electrical current.

7. The apparatus as claimed in claim 1, wherein at least one of the two magnetic fields acts inhomogeneously on at least one of the first and second magnetic sensors.

8. The apparatus as claimed in claim 1, wherein the first direction is essentially perpendicular to the second direction.

9. The apparatus as claimed in claim 1, wherein at least one magnetic field generated by the magnetic field generating device comprises an inhomogeneous magnetic field on at least one sensor element.

10. The apparatus as claimed in claim 1, wherein the first magnetic sensor and the second magnetic sensor are sensors of different types.

11. The apparatus as claimed in claim 10, wherein the first and second magnetic sensors are Hall sensors, which detect magnetic field components acting in different directions.

12. The apparatus as claimed in claim 1, wherein the spatial distribution of the first and second magnetic fields is arranged so that the ratio of the responses of the first magnetic sensor to the first and second magnetic fields is not equal to the ratio of the responses of the second magnetic sensor to the first and second magnetic fields.

13. The apparatus as claimed in claim 1, wherein the first magnetic field is generated by a first current-carrying conductor and the second magnetic field is generated by a second current-carrying conductor, the first current-carrying conductor and the second current-carrying conductor having a different distance from the sensor unit and/or a different orientation with respect to the sensor unit.

14. The apparatus as claimed in claim 1, wherein the magnetic field generating device comprises at least one current-carrying conductor.

15. The apparatus as claimed in claim 1, wherein the sensor unit furthermore comprises:
a semiconductor chip, on which or in which the first magnetic sensor and the second magnetic sensor are arranged,
a frame, on which the semiconductor chip is arranged, wherein the sensor housing is a plastic housing.

16. The apparatus as claimed in claim 15, wherein the semiconductor chip is adhesively bonded on the frame.

17. The apparatus as claimed in claim 15, wherein the sensor housing is arranged on a base plate.

18. The apparatus as claimed in claim 15, wherein at least one magnetic sensor has a sensitivity essentially in a direction perpendicular to the semiconductor chip.

19. A method for calibrating a sensor unit, wherein the sensor unit comprises:
a sensor housing,
a first magnetic sensor and
a second magnetic sensor,
emitting a first magnetic field during a first time period which acts on the sensor unit by selectively using a first part of a magnetic field generating device,
detecting a first component and a second component of the first magnetic field during the first time period using the first magnetic sensor and the second magnetic sensor, respectively, wherein the first component of the first magnetic field is in a first direction, wherein the second component of the first magnetic field is in a second direction, and wherein the first direction is not parallel to the second direction;
emitting a second magnetic field during a second, different time period which acts on the sensor unit by selectively using a second part of the magnetic field generating device, wherein the second magnetic field is different than the first magnetic field,
detecting a first component and a second component of the second magnetic field during the second, different time period using the first magnetic sensor and the second magnetic sensor, respectively, wherein the first component of the second magnetic field is in the first direction and the second component of the second magnetic field is in the second direction, and
calibrating the sensor unit using the first components of the first and second magnetic fields detected by the first magnetic sensor and using the second components of the first and second magnetic fields detected by the second magnetic sensor.

20. The method as claimed in claim 19, the spatial distribution of the first and second magnetic fields is arranged so that the ratio of the responses of the first magnetic sensor to the first and second magnetic fields is not equal to the ratio of the responses of the second magnetic sensor to the first and second magnetic fields.

21. The method as claimed in claim 19, wherein the first part of the magnetic field generating device is a first current-carrying conductor and the second part of the magnetic field generating device is a second current-carrying conductor, the first current-carrying conductor and the second current-carrying conductor having a different distance from the sensor unit and/or a different orientation with respect to the sensor unit.

22. The method as claimed in claim 19, wherein the calibration of the sensor unit is determined with the aid of responses of the first magnetic sensor and of the second magnetic sensor as magnetic sensitivities of the magnetic sensors.

23. An apparatus for calibrating a sensor unit, wherein the sensor unit comprises:
a sensor housing,
a first magnetic sensor and
a second magnetic sensor,
a magnetic field generating device, which is configured to generate a first magnetic field over a first time period and a second magnetic field over a second time period that act on the sensor unit, wherein the second magnetic field is different from the first magnetic field, wherein the first time period and the second time period are different, non-overlapping time periods, wherein the first magnetic field and the second magnetic field each have a first component and a second component, and wherein the first component of the first and second magnetic fields is not parallel to the second component of the first and second magnetic fields, respectively,
wherein the first magnetic sensor is adapted to detect the first component of the first magnetic field and the first component of the second magnetic field,
wherein the second magnetic sensor is adapted to detect the second component of the first magnetic field and the second component of the second magnetic field,
wherein the spatial distribution of the first and second magnetic fields is arranged so that the ratio of the responses of the first magnetic sensor to the first and second magnetic fields is not equal to the ratio of the responses of the second magnetic sensor to the first and second magnetic fields, and
a processing circuit configured to calibrate the sensor unit using the first components of the first and second magnetic fields detected by the first magnetic sensor and using the second components of the first and second magnetic fields detected by the second magnetic sensor.

24. The apparatus as claimed in claim 23, wherein the first magnetic field is generated by a first current-carrying conductor and the second magnetic field is generated by a second current-carrying conductor, the first current-carrying conductor and the second current-carrying conductor having a different distance from the sensor unit and/or a different orientation with respect to the sensor unit.

* * * * *